(12) United States Patent
Duboc et al.

(10) Patent No.: US 7,508,063 B2
(45) Date of Patent: Mar. 24, 2009

(54) LOW COST HERMETICALLY SEALED PACKAGE

(75) Inventors: Robert M. Duboc, Menlo Park, CA (US); Terry Tarn, San Diego, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/100,102

(22) Filed: Apr. 5, 2005

(65) Prior Publication Data

US 2006/0220199 A1  Oct. 5, 2006

(51) Int. Cl.
*H01L 23/12* (2006.01)
(52) U.S. Cl. .............. 257/704; 257/E23.193; 257/678; 257/726; 257/732; 361/803; 361/749; 174/564
(58) Field of Classification Search .......... 257/678, 257/726, 732, 686, 690, 704, E23.009, E31.117, 257/E23.117, E23.193, E23.137, E23.08, 257/681, 680; 361/803, 749, 732, 768; 174/564, 174/560
See application file for complete search history.

(56) References Cited

U.S. PATENT DOCUMENTS

| | | | |
|---|---|---|---|
| 4,178,077 A | 12/1979 | Te Velde | |
| 4,309,242 A | 1/1982 | Te Velde | |
| 4,410,906 A * | 10/1983 | Grabbe | 257/668 |
| 4,801,998 A * | 1/1989 | Okuaki | 257/681 |
| 5,010,233 A | 4/1991 | Henschen et al. | 219/209 |
| 5,175,409 A | 12/1992 | Kent | 219/85.22 |
| 5,293,511 A | 3/1994 | Poradish et al. | |
| 5,458,716 A | 10/1995 | Alfaro et al. | 156/245 |
| 5,527,744 A | 6/1996 | Mignardi et al. | |
| 5,621,162 A | 4/1997 | Yun et al. | 73/23.34 |
| 5,641,997 A * | 6/1997 | Ohta et al. | 257/788 |
| 5,654,243 A * | 8/1997 | Yoneda et al. | 29/840 |
| 5,702,764 A | 12/1997 | Kimuara et al. | 427/248.1 |
| 5,835,256 A | 11/1998 | Huibers | |
| 5,872,046 A | 2/1999 | Kaeriyama et al. | |
| 5,915,168 A | 6/1999 | Salatino et al. | 438/110 |
| 5,952,572 A | 9/1999 | Yamashita et al. | 73/504.04 |

(Continued)

FOREIGN PATENT DOCUMENTS

EP  1097901 A2  5/2001

(Continued)

OTHER PUBLICATIONS

Espinosa et al., "Identification of Residual Stress State in an RF-MEMS Device", MTS Systems Corporation white paper (May 2000).

(Continued)

*Primary Examiner*—Chris C. Chu
(74) *Attorney, Agent, or Firm*—Wade J. Brady, III; Frederick J. Telecky, Jr.

(57) ABSTRACT

Disclosed herein is a device package that comprises a device having a top substrate that is disposed on a supporting surface of a package substrate. A package frame contacts the top surface of the top substrate and top surface of the package substrate, and hermetically seals the device between the top surfaces of the top substrate and package substrate. The device can be a semiconductor device, a microstructure such as a microelectromechanical device, or other devices.

55 Claims, 5 Drawing Sheets

U.S. PATENT DOCUMENTS

| | | | |
|---|---|---|---|
| 5,963,289 A | 10/1999 | Stefanov et al. | |
| 5,998,242 A | 12/1999 | Kirkpatrick et al. | 438/127 |
| 5,999,306 A * | 12/1999 | Atobe et al. | 359/295 |
| 6,046,840 A | 4/2000 | Huibers | |
| 6,072,236 A | 6/2000 | Akram et al. | 257/698 |
| 6,144,101 A * | 11/2000 | Akram | 257/778 |
| 6,164,837 A | 12/2000 | Haake et al. | 385/90 |
| 6,165,885 A | 12/2000 | Gaynes et al. | |
| 6,191,478 B1 * | 2/2001 | Chen | 257/718 |
| 6,204,085 B1 | 3/2001 | Stumpell et al. | 438/51 |
| 6,207,548 B1 | 3/2001 | Akram et al. | |
| 6,232,150 B1 | 5/2001 | Lin et al. | |
| 6,252,229 B1 | 6/2001 | Hays et al. | |
| 6,265,246 B1 | 7/2001 | Ruby et al. | 438/113 |
| 6,274,927 B1 * | 8/2001 | Glenn | 257/680 |
| 6,287,940 B1 | 9/2001 | Cole et al. | |
| 6,297,072 B1 | 10/2001 | Tilmans et al. | 438/106 |
| 6,303,986 B1 | 10/2001 | Shook | |
| 6,323,550 B1 | 11/2001 | Martin et al. | |
| 6,336,025 B1 * | 1/2002 | Saeki | 399/301 |
| 6,342,407 B1 * | 1/2002 | Goldmann et al. | 438/124 |
| 6,353,492 B2 | 3/2002 | McClelland et al. | |
| 6,379,988 B1 * | 4/2002 | Peterson et al. | 438/51 |
| 6,458,627 B1 | 10/2002 | Choi | 438/122 |
| 6,459,523 B2 | 10/2002 | Ueda | 359/290 |
| 6,469,909 B2 * | 10/2002 | Simmons | 361/803 |
| 6,489,178 B2 | 12/2002 | Coyle et al. | 438/106 |
| 6,519,075 B2 * | 2/2003 | Carr et al. | 359/291 |
| 6,528,344 B2 | 3/2003 | Kang | 438/106 |
| 6,528,857 B1 * | 3/2003 | Glenn et al. | 257/433 |
| 6,534,340 B1 * | 3/2003 | Karpman et al. | 438/113 |
| 6,541,832 B2 | 4/2003 | Coyle | 257/415 |
| 6,603,182 B1 * | 8/2003 | Low et al. | 257/432 |
| 6,614,003 B2 | 9/2003 | Hembree et al. | 219/209 |
| 6,624,003 B1 | 9/2003 | Rice | 438/106 |
| 6,635,509 B1 * | 10/2003 | Ouellet | 438/106 |
| 6,639,313 B1 | 10/2003 | Martin et al. | 257/704 |
| 6,649,446 B1 | 11/2003 | Goetz et al. | 438/110 |
| 6,661,084 B1 | 12/2003 | Peterson et al. | 257/680 |
| 6,673,697 B2 | 1/2004 | Ma | 438/455 |
| 6,674,159 B1 | 1/2004 | Peterson et al. | 257/659 |
| 6,704,131 B2 | 3/2004 | Liu | 359/290 |
| 6,711,317 B2 * | 3/2004 | Jin et al. | 385/18 |
| 6,743,653 B2 | 6/2004 | Tanabe et al. | 438/48 |
| 6,745,449 B2 | 6/2004 | Hanna et al. | 29/458 |
| 6,764,875 B2 | 7/2004 | Shook | 438/106 |
| 6,777,767 B2 | 8/2004 | Badehi | 257/432 |
| 6,781,231 B2 * | 8/2004 | Minervini | 257/704 |
| 6,791,735 B2 | 9/2004 | Stappaerts | 359/245 |
| 6,795,120 B2 * | 9/2004 | Takagi et al. | 348/294 |
| 6,809,413 B1 | 10/2004 | Peterson et al. | 257/680 |
| 6,810,899 B2 | 11/2004 | Franz et al. | 137/79 |
| 6,827,449 B1 | 12/2004 | Klonis et al. | 353/31 |
| 6,838,762 B2 | 1/2005 | Tao et al. | 257/690 |
| 7,141,870 B2 * | 11/2006 | Yang | 257/676 |
| 7,154,053 B2 * | 12/2006 | Hsu | 174/564 |
| 2001/0007372 A1 | 7/2001 | Akram et al. | |
| 2001/0022207 A1 | 9/2001 | Hays et al. | |
| 2001/0034076 A1 | 10/2001 | Martin | |
| 2001/0040675 A1 | 11/2001 | True et al. | 355/77 |
| 2001/0048064 A1 | 12/2001 | Kitani | 250/208.1 |
| 2002/0063322 A1 | 5/2002 | Robbins et al. | 257/682 |
| 2002/0117728 A1 | 8/2002 | Brosnihan et al. | 257/446 |
| 2002/0180016 A1 | 12/2002 | Shrauger et al. | 257/678 |
| 2003/0000737 A1 | 1/2003 | Liu et al. | 174/256 |
| 2003/0008477 A1 | 1/2003 | Kang et al. | |
| 2003/0047533 A1 | 3/2003 | Reid et al. | 216/24 |
| 2003/0089394 A1 | 5/2003 | Chang-Chien et al. | 137/14 |
| 2003/0161027 A1 | 8/2003 | Kurosawa et al. | 359/290 |
| 2003/0211654 A1 * | 11/2003 | Kocian et al. | 438/116 |
| 2004/0035840 A1 | 2/2004 | Koopmans | 219/209 |
| 2004/0067604 A1 | 4/2004 | Ouellet et al. | 438/108 |
| 2004/0190112 A1 * | 9/2004 | Huibers | 359/291 |
| 2004/0232535 A1 | 11/2004 | Tarn | 257/680 |

FOREIGN PATENT DOCUMENTS

| | | |
|---|---|---|
| EP | 1101730 A2 | 5/2001 |
| EP | 1167281 A2 | 1/2002 |
| JP | 200114117 A | 5/2001 |
| JP | 2001129800 A | 5/2001 |
| JP | 2001196484 A | 7/2001 |
| WO | WO-01/10718 A1 | 2/2001 |
| WO | WO-01/20671 A1 | 3/2001 |
| WO | WO-02/12116 A2 | 2/2002 |
| WO | WO-02/12116 A3 | 2/2002 |

OTHER PUBLICATIONS

Franka et al., "Solder Bump Technology: Present and Future", Semiconductor Fabtech (May 1995).

Glenn et al., "Packaging Microscopic Machines", Machine Design (Dec. 7, 2000).

Harsh et al., "Flip-Chip Assembly for Si-Based MEMS", Proceedings of the 1999 IEEE International Conference on Microelectromechanical Systems (MEMS '99), Orlando, FL (Jan. 17-21, 1999), pp. 273-278.

Irwin et al., "Quick Prototyping of Flip Chip Assembly with MEMS", University of Colorado at Boulder white paper (Jul. 17, 2000).

.Irwin et al., "Quick Prototyping of Flip-Chip Assembly with MEMS", portions of slide presentation from the NSF Center for Advanced Manufacturing and Packaging of Microwave, Optical and Digital Electronics at the University of Colorado at Boulder (1998).

Lee et al., "High-Q Tunable Capacitors and Multi-way Switches Using MEMS for Millimeter-Wave Applications", portions of slide presentation from the NSF Center for Advanced Manufacturing and Packaging of Microwave, Optical and Digital Electronics at the University of Colorado at Boulder (Sep. 1998).

Lee et al., "Use of Foundry Services to Prototype MEMS for Millimeter-wave Applications", portions of slide presentation from the NSF Center for Advanced Manufacturing and Packaging of Microwave, Optical and Digital Electronics at the University of Colorado at Boulder (1998).

Luxbacher, T., "Spray Coating for MEMS, Interconnect & Advanced Packaging Applications", HDI Magazine (May 1999) (abstract only).

Moore, D., "Automation Requirements for Die Bonding Process", Electronics Engineer (Jul. 2000).

Tsau, C., "Wafer-Level Packaging", MIT Microsystems Technology Laboratories Annual Report (May 2000), p. 49.

Tom Glenn, et al., Packaging Microscopic Machines, Machine Design, Dec. 7, 2000.

Balaji Sridharan, et al., Post-Packaging Release a New Concept for Surface Micromachined Devices, Mechanical and Aerospace Engineering Department, 4 pgs.

U. Gosele, et al., Wafer Bonding for Microsystems Technologies, Sensors and Actuators 74 (1999) pp. 161-168.

Masao Segawa, et al., A CMOS Image Sensoer Module Applied for a Digital Still Camera Utilizing the Tab on Glass (TOG) Bonding Method, IEEE Transactions on Advanced Packaging, vol. 22., No. 2.

In-Byeong Kang, et al., The Application of Anisotropic Conductive Films for Realisation of Interconnects in Micromechanical Structures, SPIE vol. 3321, pp. 233-238.

Sonja van der Groen, et al., CMOS Compatible Wafer Scale Adhesive Bonding for Circuit Transfer, International Conference on Solid-State Sensors and Actuators, Chicago, Jun. 16-19, 1997, pp. 629-632.

G. Klink, et al., Wafer Bonding With an Adhesive Coating, Part of the SPIE Conference on Micromachined Devices and Components IV, Santa Clara, California ,Sep. 1998, pp. 50-61.

Christine Kallmayer, et al., A New Approach to VHIP Size Package Using Meniscus Soldering and FPC-Bonding, IEEE Transactions on Components Packaging and Manufacturing Technology-Part C., vol. 21, No. 1., Jan. 1998, pp. 51-56.

Joachim Kloeser, et al., Low Cost Bumping by Stencil Printing: Process Qualification for 200 μM Pitch, 1998 International Symposium on Microelectronics, 11 Pgs.

Michel M. Maharbiz, et al., Batch Micropackaging by Conpression-Bonded Wafer-Wafer Transfer, Microassembly Technologies, Inc, 8 Pgs.

Bharat Shivkumar, et al., Microrivets for MEMS Packaging:Concept, Fabriaction, and Strength Testing, Journal of Microlectroomechanical Systems, vol. 6, No. 3, Sep. 1997, pp. 217-224.

Hideki Takagi, et al., Room Temperature Silicon Wafer Direct Bonding in Vacuum by Ar Beam Irradiation, Mechanical Engineering Laboratory, AIST. MITI., 6 Pgs.

Michael H. Beggans, et al., Optical Pressure Sensor Head Fabrication Using Ultra-Thin Silicon Wafer Anodic Bonding, Part of the Symposium on Design, Test, and Microfabrication of MEMS and MOEMS, 10 Pgs.

T.P Glenn, et al., Designing MEMS Into Systems:Packaging Issues, http://www.ecnmag.com, 4 Pgs.

Y.T. Cheng, et al.,"Localized Silicon Fusion and Eutectic Bonding for MEMS Fabrication and Packaging", Journal of Microelectromechanical Systems, vol. 9, No. 1, Mar. 2000, pp. 3-8.

Liwei Lin, "MEMS Post-Packaging by Localized Heating and Bonding", 2000 IEEE, pp. 608-616.

Farhad Sarvar, et al., Application of Adhesives in MEMS and MOEMS Assembly: A Review, IEEE Polytronic 2002 Conference, pp. 22-28.

Seong-A Kim, et al., "Closed Loop Solder-Lines on Heated Substrates", 2002 Electronic Components and Technology Conference, pp. 1101-1105.

Giles Huimpston and David M. Jacobson, "Principles of Soldering and Brazing", ASM International, pp. 242-245-7.3.2.3 Solution.

US 6,724,518, 04/2004, Meyer et al. (withdrawn)

* cited by examiner

LOW COST HERMETICALLY SEALED PACKAGE

TECHNICAL FIELD OF THE INVENTION

The present invention is generally related to the art of packaging methods for microstructure devices (e.g. any device that receives or transmits electronic signals) including microelectromechanical devices, semiconductor devices, light emitting devices, spatial light modulating devices, or light detecting devices.

BACKGROUND OF THE INVENTION

Microstructures, such as microelectromechanical devices, have many applications in basic signal transduction. For example, a spatial light modulator based on a microelectromechanical device (MEMS) modulates light beams in response to electrical or optical signals. Such a modulator can be a part of a communication device or an information display. For example, micromirrors are key components of MEMS-based spatial light modulators. A typical MEMS-based spatial light modulator usually consists of an array of miniature reflective deflectable micromirrors. These micromirrors can be selectively deflected in response to electrostatic forces so as to reflect incident light by individual micromirrors for producing digital images. Such micromirrors, however, are sensitive to temperature and contamination, such as moisture and dust. This contamination has varying effects on the micromirrors, from capillary-condensation and post-release stiction to deterioration of the micromirror surfaces, which may result in mechanical failure of the micromirror devices in operation. For this and other reasons, micromirror devices are often packaged after releasing.

Regardless of differences of the packaging methods currently developed for a micromirror array device, two substrates, one for supporting the device and another one for covering the device, and sealing medium(s) for bonding the two substrates are utilized. Most of the sealing mediums require application of heat during bonding and sealing. The heat, however, may degrade the micromirror array device if not properly applied, especially for those microstructures and semiconductor devices that are temperature sensitive. For example, improperly applied heat may change the desired mechanical properties of the microstructures. It may also thermally activate particles, such as impurities and particles making up the functional components of the microstructures, prompting diffusion of these activated particles within the microstructures, thus exacerbating degradation of the microstructures. Or heat may decrease anti-stiction materials within the package.

Therefore, a method and an apparatus are needed for packaging microstructure, semiconductor, light emitting device, light modulating device, or light detecting device, particularly those that are temperature sensitive during packaging.

SUMMARY OF THE INVENTION

In view of the forgoing, the present invention provides a method and apparatus for packaging microstructures using a hermetic packaging frame. The frame hermetically bonds the top surface of the microstructure to a package substrate so as to enclose the functional members of the microstructure with the space between the top surface of the device and the package substrate. Alternatively, the frame and the device bonded to the package substrate can be further covered with in a space between the package substrate and a package cover that may or may not be hermetically bonded to the package substrate.

In an embodiment of the invention, a device package is disclosed. The package comprises: a package substrate; a microstructure device having a top device substrate; a package frame that is hermetically bonded to a top surface of the top device substrate and the package substrate such that the microstructure is hermetically sealed within a space between the top surface of the top device substrate, the packaging frame, and the packaging substrate.

In another embodiment of the invention, a device package is disclosed, which comprises: a package substrate; a device comprising a top and bottom device substrates that are bonded together, wherein the bottom device substrate is attached to the packaging substrate; and wherein the top device substrate is hermetically bonded to the package substrate.

In yet another embodiment of the invention, a method is disclosed, which comprises: providing a top device substrate, a bottom device substrate, an array of reflective deflectable mirror plates, and an array of addressing electrodes associated with the array of mirror plates, wherein the mirror plates and addressing electrodes are disposed between the top and bottom device substrates; bonding the top and bottom device substrate so as to form a device assembly; disposing the assembly on the packaging substrate; and hermetically sealing the top device substrate to the packaging substrate such that the mirror plate and addressing electrode arrays are hermetically sealed.

In yet another embodiment of the invention, a method of packaging a microstructure device comprising first and second device substrates is disclosed, which comprises: hermetically bonding the first device substrate to a packaging substrate so as to form a hermetic device package; and non-hermetically sealing the hermetic device package between a packaging cover and the packaging substrate.

The objects of the invention are achieved in the features of the independent claims attached hereto. Preferred embodiments are characterized in the dependent claims.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE INVENTION

The present invention will be discussed in the following with reference to examples wherein the microstructures are micromirror array devices. Each micromirror array device comprises an array of deflectable and reflective mirror plates enclosed within a space between two substrates. It will be appreciated by those skilled in the art that such the following description is based on selected examples of the invention and should not be interpreted as a limitation of the invention with regard to alternative embodiments that are not explicitly described herein. In particular, although not limited thereto, the present invention is particularly useful for packaging microstructures, semiconductor devices, such as circuits formed on a semiconductor substrate, light emitting devices, such as LEDs and OLEDs, light modulators, such as MEMS-based mirror arrays, LCDs, LCOS, and optical switches, light detecting devices, such as image sensors, or detectors (e.g. CCDs). Other variations without departure from the sprit of the present invention may also be applicable.

Figure 1:
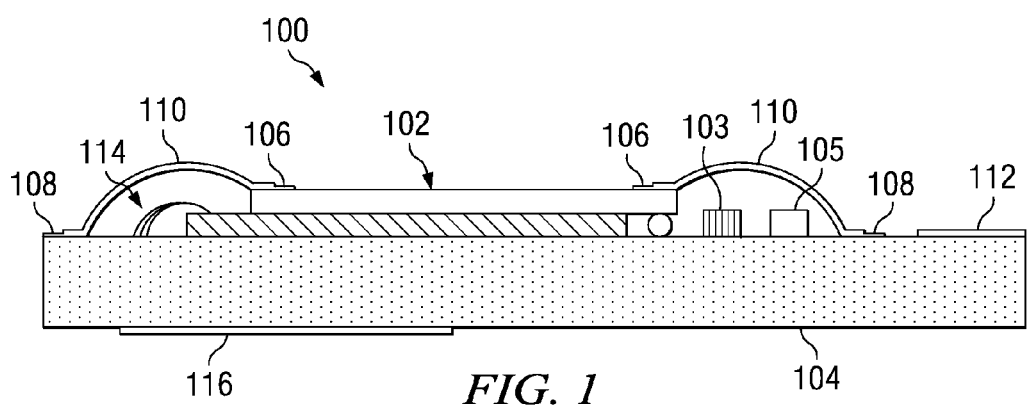
FIG. 1 is a cross-sectional view of a hermetically sealed device package using a hermetic packaging frame in accordance with an embodiment of the invention.

Referring to FIG. 1, an exemplary device package is illustrated therein. Micromirror array device 102 of device package 100 comprises a top and bottom substrates. The top substrate can be a light transmissive substrate, such as glass and quartz, while the bottom substrate can be a semiconductor substrate. An array of deflectable reflective mirror plates and an array of addressing electrodes associated with the mirror plates for addressing and deflecting the mirror plates are enclosed within a space between the top and bottom substrates, which are not shown in this figure, but examples of which will be better illustrated in FIGS. 6 to 9 afterwards. The top and bottom substrates are preferably non-hermetically bonded together.

The micromirror array device is held by package substrate 104 with the bottom substrate being attached and bonded to the supporting surface of the package substrate using any suitable adhesive materials, such as glue and epoxy. Alternatively, the bottom substrate can be bonded to the package substrate using one or more substrate inserts. Specifically, a substrate insert can be disposed between and bonded to the bottom substrate and the package substrate, as set forth in U.S. patent application Ser. No. 10/698,656 filed Oct. 30, 2003, the subject matter being incorporated herein by reference. In addition to the insert substrate, compliant adhesive materials can also be used for bonding the bottom substrate of the micromirror device to the package substrate, as set forth in U.S. patent application "Micromirror Array Device with Compliant Die-Attach Adhesive Substrate" filed with the current application, the subject matter being incorporated herein by reference.

Package substrate 104 may be any suitable, preferably non-electrically conducting materials, preferably ceramic or glass, and more preferably ceramic (e.g. $AlO_x$). Other materials (e.g. organic or hybrid organic-inorganic materials) could also be used. If the package substrate is composed substantially of conducting materials and a heater is employed, the package substrate may comprise a laminate having the heater being laminated between two insulating substrate layers, as set forth in U.S. patent application Ser. No. 10/443,318 to Tam filed May 22, 2003, the subject matter being incorporated herein by reference. Alternatively, the package substrate may be composed of non-ceramic materials. For example, the package substrate can be plastic.

In the example as shown in FIG. 1, the package substrate is flat. Alternatively, the package may comprises a concaved surface that forms a cavity in which the micromirror array device can be positioned, as set forth in U.S. patent application Ser. No. 10/443,318 to Tam filed May 22, 2003, which will not be discussed in detail herein.

Formed on the package substrate may be other functional structures, such as electrical contacts 112 and 116. These electrical contacts are electrically connected to the electrical contacts of the micromirror array device by wires 114.

Hermetic packaging frame 110 hermetically bonds the top substrate of the micromirror device to the package substrate. Specifically, the hermetic packaging frame is hermetically bonded to the upper surface of the top substrate of micromirror array deice 102 with sealing medium 106, and meanwhile, hermetically bonded to the surface of the package substrate using sealing medium 108. As a result, the micromirror array device, as well as wires 114, but not the upper surface is hermetically sealed within the space between the hermetic packaging frame, the upper surface of the device top substrate, and the packaging substrate.

The hermetic packaging frame may be any suitable preferably metallic metals (e.g. cupper and aluminum, plastic, or the materials for packaging substrate 104. In particular, the hermetic packaging frame can be flexible so as to, for example be able to balance the pressure of the hermetically sealed device and pressure of the environment. In this instance, it is preferred that the packaging frame is thin, for example, with a thickness of 1 mm or less, such as 0.5 mm or less, and 0.1 mm or less, but with a sufficient elasticity such that the packaging frame will not break when it is been stretched during deformation due to the pressure difference.

Figure 2:
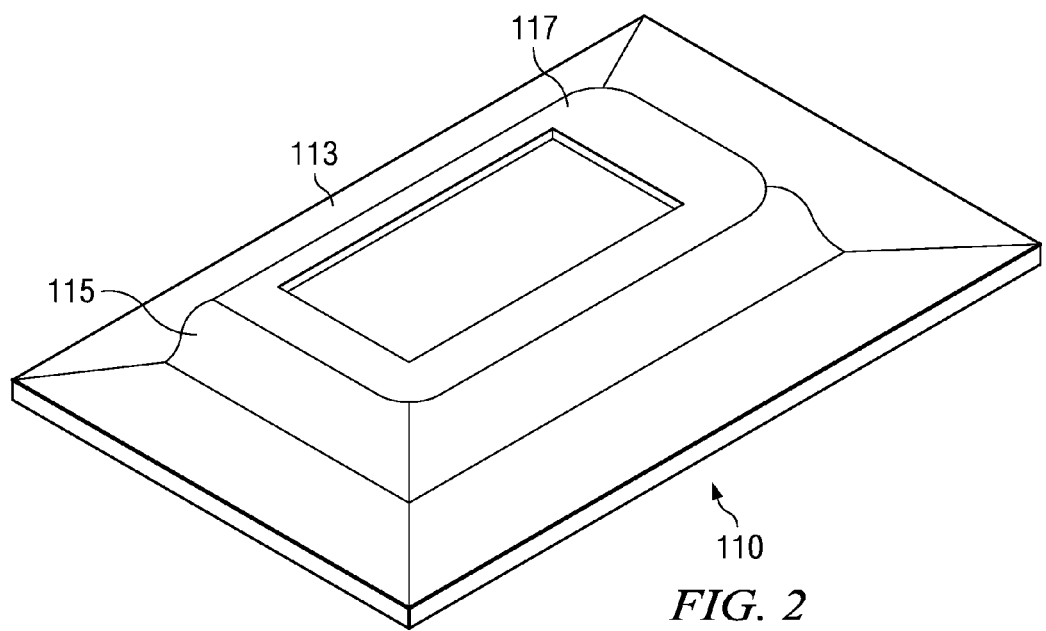
FIG. 2 shows a perspective view of the hermetic foil in FIG. 1.

The hermetic packaging frame may be configured into many proper shapes, a perspective view of one of which is illustrated in FIG. 2. Referring to FIG. 2, the hermetic packaging frame comprises frame base 113, frame wall 115 formed on the frame base, and frame ledge 117. The frame ledge extends from the top surface rim of the frame wall towards the inner space surrounded by the frame walls, leaving an opening in the upper surface of the packaging frame, as shown in the figure. The resulted opening may be covered by an inlay light transmissive plate if desired to protect the exposed upper surface of the device top substrate and/or to further protect the enclosed micromirror array device. In accordance with an embodiment of the invention, the frame ledge of the packaging frame is hermetically bonded to the upper surface of the device top substrate (as illustrated in FIG. 1) using sealing medium 106; and the frame base is hermetically bonded to the package substrate 104 using sealing medium 108.

The sealing mediums 106 and 108 are preferably materials that are stable, reliable, cost-effective and of good thermal-properties (e.g. co-efficient of thermal expansion (CTE) thermal-conductivity etc.); and the two sealing mediums may or may not be the same depending upon the materials of the package members to be bonded, such as the packaging frame, the top substrate of the device, and the packaging substrate. The sealing mediums can be welding or soldering materials. For example, when the packaging frame is metallic and the device top substrate is glass or quartz, sealing medium 106 is preferably a bonding material suitable for welding or soldering metallic materials to glass or quartz. In the same example when the package substrate is ceramic, sealing medium 108 is preferably a bonding material suitable for welding or soldering metallic materials and ceramic materials.

The sealing material can be an inorganic material, such as a metal, a metal alloy, a metal compound (e.g. a metal or metalloid oxide) or a glass frit. It is preferred that the sealing medium has a melting temperature of 160° C. or higher, or 180° C. degrees or higher, 200° C. or higher, or even 350° C. degrees or higher for reliable seal quality. An advantage of using a sealing medium having high melting (or soldering) temperature is that the sealing quality will not degrade, especially in the following package treatments such as package baking. Exemplary sealing mediums comprise glass frit, such as Kyocera KC-700, $BiIn_x$, $AuSn_x$, Au, $BiSn_x$, $InAg_x$, $PbSn_x$, and copper. It is preferred that the sealing medium comprises tin or lead. In addition, a glass frit, such as Kyocera KC-700 can also be used as the sealing medium.

However, most solderable metallic materials have poor adhesion to oxide materials that often compose the surfaces of the substrates (e.g. the ceramic package substrate and the device top substrate). To solve this problem, metallization layers can be applied to the bonding surfaces before applying the solderable metallic sealing mediums.

As a way of example, a top metallization layer can be applied to the upper bonding area in the upper surface of device top substrate for metalizing said upper bonding area. The metallization layer is preferably composed of a material with a high soldering temperature, such as 150° C. degrees or higher, or 180° C. degrees or higher. Exemplary metallization materials are aluminum, gold, nickel, or composition of two or more of suitable metallic elements, such as $AuNi_x$. These materials can be deposited on the upper bonding area (e.g. around the parameter of the device top substrate) as thick or thin films using suitable deposition methods, such as sputtering printing, spin-on-glass or pasting. In an example of the invention, the metallization medium layer is a thin layer of noble metallic material, such as gold. This metallization medium layer is preferably sputtered as a film on the lower surface of the cover substrate. On the upper bonding area with the upper metallization layer, sealing medium 106 is then deposited so as to bond the ledge of the packaging frame to the top substrate of the device. Alternatively, especially when the packaging frame is non-metallic such as a ceramic material, another metallization layer can be applied to the lower surface of the frame ledge before bonding the ledge to the sealing medium (106).

Similar to that in bonding the frame ledge to the device top substrate, a lower metallization layer can be applied to the lower bonding area in the packaging substrate 104. On such lower bonding area with the metallization layer, sealing medium 108 is deposited so as to hermetically bond the frame base to the packaging substrate.

In accordance with another example of the invention, the metallization layers each can be a multilayered structure, e.g. comprising metal-oxides (e.g. $CrO_2$ and $TiO_2$) and/or elemental metals (e.g. Cr, Au, Ni, and Ti). When the metallization layer comprises metal-oxide and metallic layers, the metal-oxide layer is first deposited on the surface of the non-metallic substrate (such as ceramic packaging substrate or the glass top substrate of the device), because it presents strong adhesion to the non-metallic substrate's surface, which is generally oxidized. The metallic layer is then attached to the metal-oxide layer. As another example, the metallization layers each may comprise a $CrO_x$ layer (e.g. layer 112) followed by a Cr layer (or a Ti layer), followed by a Ni layer (or Pt layer) and then followed by an Au layer. The $CrO_2$ layer is provided as a light blocking frame for absorbing scattered light. Cr layer is provided for improving the adhesion of the succeeding metallic layers to the $CrO_2$ layer. The Ni layer is provided as a metallization layer. Because the Ni layer is easily oxidized, the Au layer is provided for preventing such oxidation. The Ni layer may be deposited as a thick layer for improving the bond of the solder layer to the substrate (or the cover substrate). However, a thick Ni layer may cause extra stress or distortion to the package system. To avoid this, one or more Au layers can be inserted into the thick Ni layer, resulting in an alternating Ni, Au, Ni, and Au layers. Also, the $CrO_2$ layer can be formed by forming a Cr layer followed by oxidation of the formed Cr layer, which can also be followed by the Ni (or Pt) layer.

In addition to the light blocking frame, an anti-reflection (AR) film may be employed on the glass top substrate of the device. The AR-film can be deposited on either surface of the glass substrate. When the AR-film is coated on the lower surface of the glass substrate, it is preferred that the AR-film does not cover the periphery portion to which the metallization material is to be applied, because the AR-film may degrade the adhesion of the metallization material to the surface of the cover substrate. In fabrication, the AR-film can be deposited on the lower surface of the glass substrate before or after deposition of the metallization material.

During the bonding process, external forces, such as external pressure, heat, or radiation may be applied. After a predetermined time period when the cover substrate and the packaging substrate are securely bonded, the external forces can be withdrawn, but not necessarily at the same time.

Inside the hermetic package may be other suitable devices, such as getter 103 for absorbing gases, moisture and/or impurity particles (e.g. organic particles), and lubricant 105 for lubricating the surfaces of the microstructures (e.g. micromirror array device) can be provided within the package. The getter and lubricants can be applied in may alternative ways, such as those described in U.S. patent applications Ser. No. 10/890,352 filed Jul. 12, 2004, Ser. No. 10/810,076 filed Mar. 26, 2004, and Ser. No. 10/811,449 filed Mar. 26, 2004, the subject matter of each being incorporated herein by reference.

When the device in the package is a might detecting or modulating device, such as a CCD or a spatial light modulator device, a light blocking/absorbing mask can be provided. For example, a light blocking/absorbing mask can be disposed on a surface (e.g. the top or the bottom surface) of the top substrate of the device for blocking and/or absorbing incident light illuminating the circumference of the device.

In hermetically bonding the packaging frame to the packaging substrate and the top substrate of the device, localized heating is often desired. The localized heating can be accomplished by providing an integral heater in the packaging substrate, as set forth in U.S. patent application Ser. No. 10/443,318 to Tam filed May 22, 2003, the subject matter being incorporated herein by reference.

Figure 3:
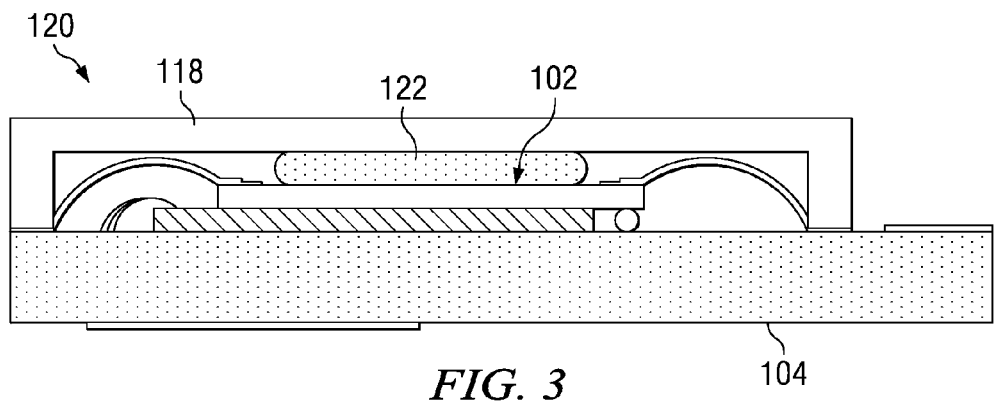
FIG. 3 is a cross-sectional view of another hermetically sealed device package using a hermetic packaging frame in accordance with another embodiment of the invention.

In addition to the hermetic packaging using the packaging frame wherein the packaging frame is hermetically bonded to the top substrate of the device (such that the top surface is partially exposed), the hermetically packaged micromirror device can be further protected (or packaged), as shown in FIG. 3.

Referring to FIG. 3, micromirror array device 102 is hermetically packaged within a space between the top substrate of device 102, the packaging frame 110, and packaging substrate 104. Package cover 118 is provided and bonded to the package substrate hermetically or non-hermetically so as to enclose the hermetically packaged micromirror array device within a space between the package cover and package substrate. The package cover can be any suitable materials, such as those materials suitable for the packaging frame. However, the packaging cover is preferably ceramic with an inlay light transmissive window on the top surface and aligned to the substrate of the micromirror array device, such that, the incident illumination light can travel through the inlay window in the packaging cover, the top substrate of the device, and illuminate the reflective mirror plates of the micromirror array device.

The packaging cover can be bonded to the packaging substrate hermetically or non-hermetically with a selected bonding method (and appropriate bonding material) applicable in bonding the packaging frame to the top substrate device or the packaging substrate as discussed above, which will not be repeated herein. The gap between the top substrate of the device and the package cover as shown in the figure can be filed with an optical material (122) with an optical index compatible to the optical indices of the package cover and the top substrate of the device, as set forth in U.S. patent application Ser. No. 10/404,221 to Huibers filed Mar. 31, 2003, the subject matter being incorporated herein by reference.

Figure 4:
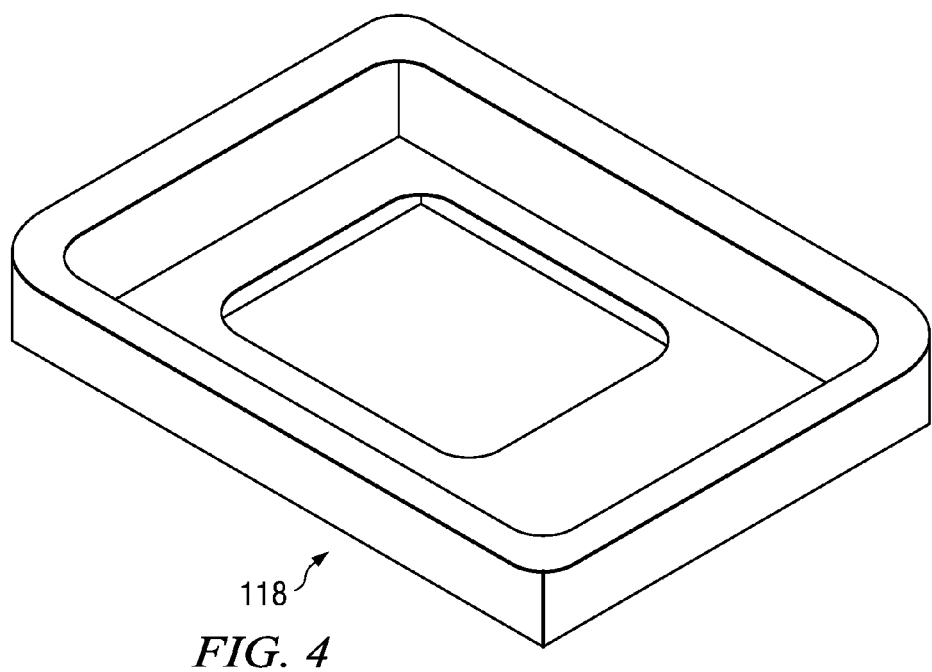
FIG. 4 illustrates an exemplary package cover in FIG. 3.

Package cover 118 may have many suitable shapes, one of which is illustrated in FIG. 4. Referring to FIG. 4, the walls and the bottom surface of the packaging cover 118 together form a cavity. The surface of the cavity has an opening that may be covered by an inlay light transmissive window, such as glass or quartz.

Figure 5:
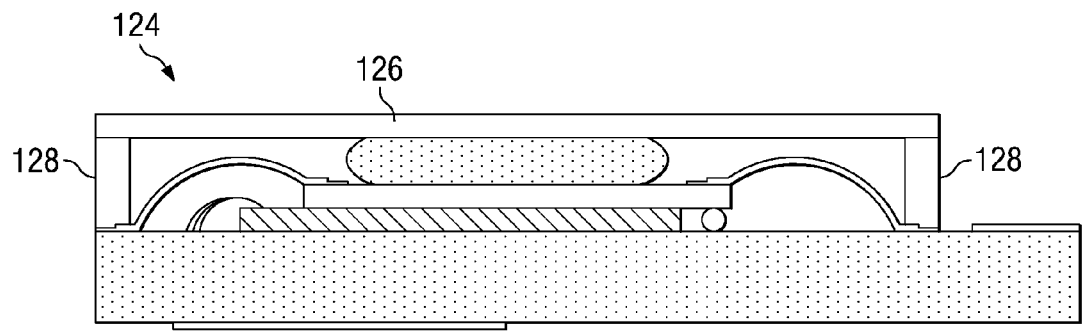
FIG. 5 is a cross-sectional view of yet another hermetically sealed device package using a hermetic foil barrier in accordance with yet another embodiment of the invention.

Other than the package cover 118 illustrated in FIG. 4, the package cover can be a flat plate and connected to the package substrate with a spacer, as shown in FIG. 5. Referring to FIG. 5, packaging cover 126 is a flat plate that is preferably transmissive to visible light. If the package cover plate is not transmissive to visible light, a light transmissive window is made in the cover plate. The package cover plate is then bonded to and thus supported by spacer 128 that bonds the package cover plate to the packaging substrate. The gap between the package cover and the top substrate of the micromirror array device can be filled with an optical material, as that in FIG. 3.

Figure 6:
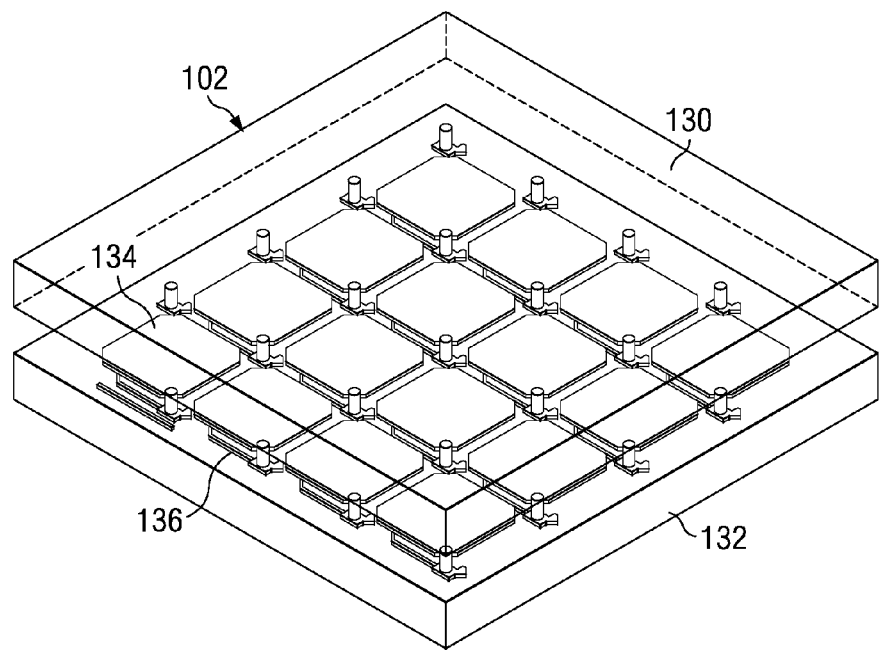
FIG. 6 shows a perspective view of an exemplary device in the package of FIGS. 1, 3, and 5.

As a way of example, an exemplary micromirror array of a spatial light modulator device of FIG. 1 is illustrated in FIG. 6. For simplicity purposes, only 4×4 micromirror devices are illustrated therein. In general, the micromirror array of a spatial light modulator consists of thousands or millions of micromirrors, the total number of which determines the resolution of the displayed images. For example, the micromirror array of the spatial light modulator may have 1024×768, 1280×720, 1400×1050, 1600×1200, 1920×1080, or even larger number of micromirrors. In other applications, the micromirror array may have less number of micromirrors.

The micromirrors 134 are formed on light transmissive substrate 130 separate from substrate 132 on which the addressing electrodes 136 are formed. Alternatively, the micromirrors and the addressing electrodes can be formed on the same substrate, preferably a semiconductor wafer, such as semiconductor substrate 132. In another embodiment of the invention, the micromirror substrate can be bonded to a transfer substrate, and then the micromirror substrate along with the transfer substrate is attached to another substrate such as a silicon substrate having electrodes and circuits formed thereon followed by removal of the transfer substrate and patterning of the micromirror substrate to form the micromirrors.

Figure 7:
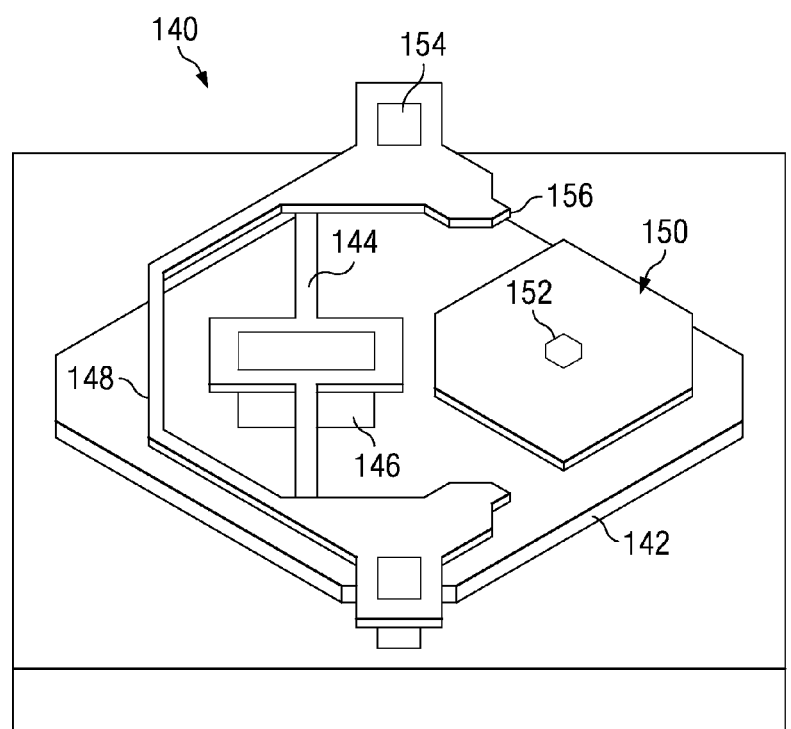
FIG. 7 illustrates a perspective view of an exemplary micromirror of the micromirror array device in FIG. 6.

An exemplary micromirror of the micromirror array in FIG. 6 is illustrated in FIG. 7. Referring to FIG. 7, deflectable reflective mirror plate 142 is attached to deformable hinge 144 such that the mirror plate can rotate above substrate 130. The deformable hinge is held by hinge support 148 that is connected to and held by posts 154. Other features may also be provided, such as stopper 156 and extending plate 150. The stopper is provided for stopping the rotation of the mirror plate when the mirror plate arrives at the desired angle (e.g. the ON state angle). The extending plate is connected to the mirror plate via contact 152 so as to improving electrostatic coupling of the mirror plate to the applied electrostatic field, as set forth in U.S. patent application Ser. No. 10/613,379 to Patel filed Jul. 3, 2003, the subject matter being incorporated herein by reference.

The mirror plate can be attached to the deformable hinge symmetrically or asymmetrically. Specifically, when the mirror plate is attached to the hinge with the attachment point at a location offset from the geometric or mass center of the mirror plate, the mirror plate is operable to rotate to a larger angle in one direction than in the opposite. Alternatively, the mirror plate can be attached to the hinge with the attachment point substantially at the geometric or mass center of the mirror plate, the mirror plate symmetrically rotates to both directions.

In the above example, the deformable hinge is formed underneath the mirror plate in the direction of the incident light—that is the mirror plate is between the light transmissive substrate (130) and the deformable hinge; alternatively, the deformable hinge can be fabricated on the same side as the light transmissive substrate of the mirror plate.

Figure 8:
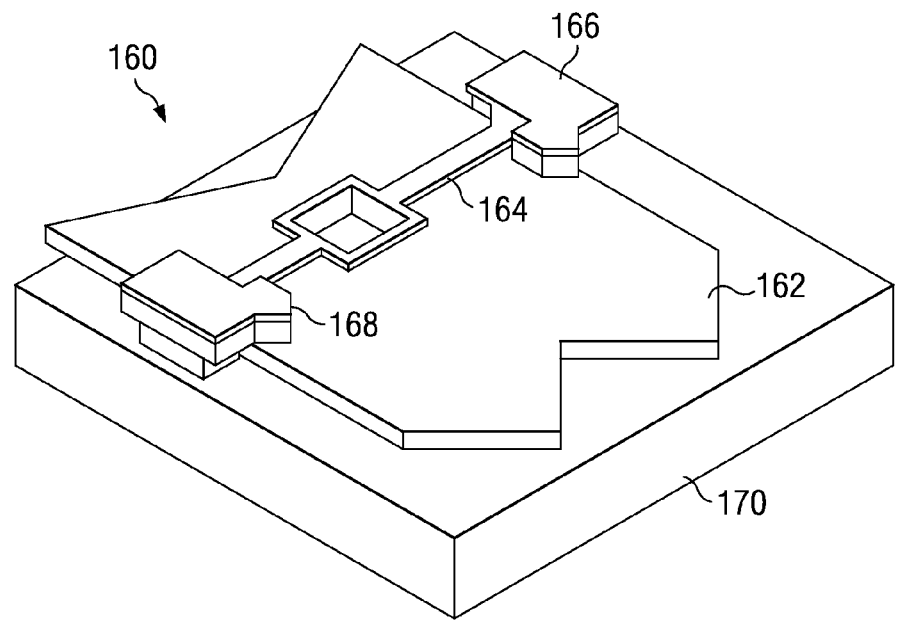
FIG. 8 shows a perspective view of another exemplary micromirror.
Figure 9:
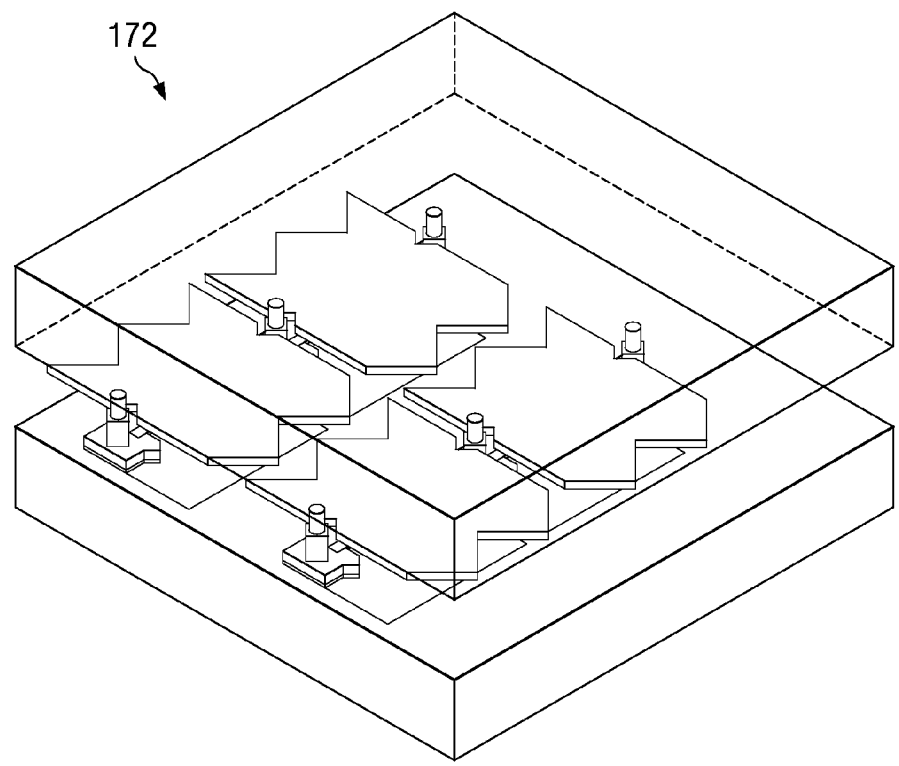
FIG. 9 illustrates a perspective view of an exemplary micromirror array of the micromirror in FIG. 8.

The mirror plate can also be patterned in different shapes. For example, other than the substantial square in FIG. 7, the mirror plate may have zigzagged edges, as shown in FIG. 8. Referring to FIG. 8, micromirror 160 comprises mirror plate 162 with a zigzagged edge. The mirror plate is attached to deformable hinge 164 such that the mirror plate can rotate above substrate 170. The deformable hinge is held by posts 166 that are formed on substrate 170. An exemplary micromirror array of a spatial light modulator is illustrated in FIG. 9. For simplicity purposes, only 2×2 micromirrors are illustrated.

Figure 10:
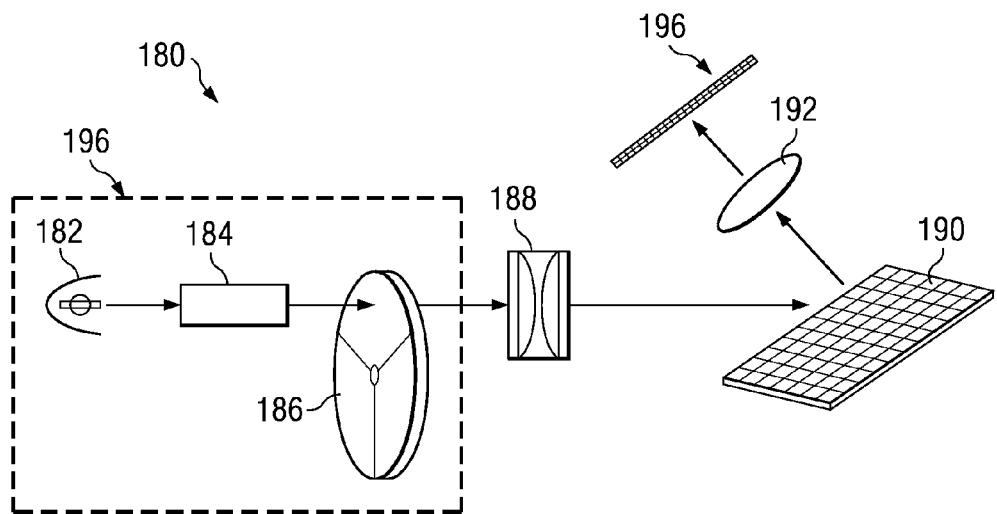
FIG. 10 demonstratively illustrates an exemplary display system employing a micromirror array device.

Referring to FIG. 10, a typical display system employing a spatial light modulator having a micromirror array device package is illustrated therein. In its very basic configuration, the display system comprises light source 182, optical devices (e.g. light pipe 184, lens 188 and 192), color wheel 186, display target 196 and spatial light modulator 190 that uses micromirror array device package. The light source (e.g. an arc lamp) directs incident light through the color wheel and optical devices (e.g. the light pipe and object lens) and shines on the spatial light modulator. The spatial light modulator selectively reflects the incident light toward optical device 192 and results in an image on display target 196. The display system can be operated in many ways, such as those set forth in U.S. Pat. No. 6,388,661, and U.S. patent application Ser. No. 10/340,162, filed on Jan. 10, 2003, both to Richards, the subject matter of each being incorporated herein by reference.

Figure 11:
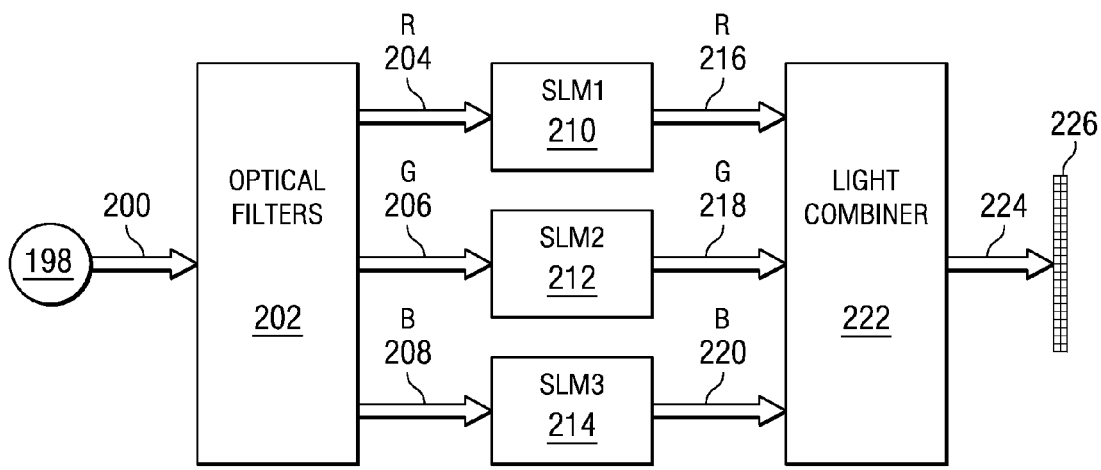
FIG. 11 demonstratively illustrates another exemplary display system employing multiple micromirror array devices.

Referring to FIG. 11, a block diagram illustrating a display system employing three spatial light modulators, each having a micromirror array device package, is shown, wherein each spatial light modulator is designated for respectively modulating the three primary color (i.e. red, green and blue) light beams. As shown, light 200 from light source 198 passes through optical filters 202 and is split into three primary color light beams, that is, red light 204, green light 206 and blue light 208. Alternatively, the primary colors can be yellow, cyan, and magenta. Each color light beam impinges a separate spatial light modulator and is modulated thereby. Specifically, red light 204, green light 206, and blue light 208 respectively impinge spatial light modulators 210, 212 and 214 and are modulated. The modulated red light 216, green light 218, and blue light 220 are recombined at light combiner 222 for forming modulated color images. Combined color light 224 is directed (e.g. by projection lens) onto the display target 226 for viewing.

It will be appreciated by those skilled in the art that a new and useful method of packaging microstructure and semiconductor devices has been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. In particular, other protective materials, such as inert gas, may be filled in the space formed by the package substrate and the cover substrate. For another example, the package substrate, as well as the cover substrate and the spacer, can be other suitable materials, such as silicon dioxide, silicon carbide, silicon nitride, and glass ceramic. For yet another example, other suitable auxiliary methods and components, such as applications of Infrared Radiation during bonding for soldering the sealing medium layers, and pillars or other structures for aligning the substrates are also applicable. Moreover, other desired materials, such as anti-stiction material, preferably in vapor phase for reducing stiction of the micromirrors of the micromirror array device, may also be deposited inside the package. The anti-stiction material can be deposited before bonding the cover substrate and lower substrate. When the cover substrate is glass that is visible light transmissive, it can be placed parallel to the micromirror array device and the package substrate. Alternatively, the cover substrate may be placed at an angle with the micromirror array device or the package substrate. Therefore, the invention as described herein contemplates all such embodiments as may come within the scope of the following claims and equivalents thereof. In the claims, only elements denoted by the words "means for" are intended to be interpreted as means plus function claims under 35 U.S.C. §112, the sixth paragraph.

We claim:

1. A device package comprising:
   a top substrate;
   a semiconductor substrate of a microstructure device, said semiconductor substrate being bonded to the top substrate forming a first cavity therebetween;
   a package substrate on which the semiconductor substrate is disposed; and
   a package frame that is hermetically bonded to the top substrate and to the package substrate forming a second cavity between the package frame and the package substrate.

2. The device package of claim 1, wherein the microstructure device is a light emitting device or a light detecting device.

3. The device package of claim 1, wherein the package frame is flexible.

4. The device package of claim 1, wherein the microstructure device is a spatial light modulator that comprises an array of deflectable reflective mirror plates and an array of addressing electrodes associated with the array of mirror plates for deflecting the mirror plates.

5. The device package of claim 4, wherein the mirror plates are disposed on the top substrate that is light transmissive.

6. The device package of claim 5, wherein the addressing electrodes are disposed on the semiconductor substrate.

7. The device package of claim 6, further comprising a getter disposed between the top and bottom substrates of the microstructure device.

8. The device package of claim 6, further comprising a lubricant material disposed between the top and bottom substrates of the microstructure device.

9. The device package of claim 4, wherein the mirror plates are disposed on the semiconductor substrate.

10. The device package of claim 1, wherein the semiconductor substrate is bonded to the packaging substrate via an insert plate disposed therebetween.

11. The device package of claim 1, further comprising a getter that is disposed within the second cavity.

12. The device package of claim 1, further comprising a lubricant that is disposed within the second cavity.

13. The device package of claim 1, wherein the packaging frame comprises a frame base, a frame wall, and a frame ledge, wherein the frame base is hermetically bonded to the packaging substrate, and wherein the frame ledge is hermetically bonded to an upper surface of the top substrate of the microstructure device.

14. The device package of claim 13, wherein the frame ledge is bonded to the upper surface using first solder material.

15. The device package of claim 14, wherein the frame base is bonded to the packaging substrate using second solder material.

16. The device package of claim 1, further comprising a packaging cover that is bonded to the package substrate such that the hermetically sealed microstructure device with the package frame is enclosed within a space between the packaging cover and the package substrate.

17. The device package of claim 16, wherein the packaging cover comprises a concaved surface defining a cavity and a cover substrate wall, wherein the hermetically sealed microstructure device is disposed within the cavity, and the cover substrate wall is bonded to the package substrate.

18. The device package of claim 16, wherein the packaging cover is hermetically bonded to the package substrate.

19. The device package of claim 16, wherein the packaging cover is non-hermetically bonded to the package substrate.

20. The device package of claim 1, further comprising a light blocking/absorbing frame for blocking/absorbing visible light incident around the perimeter of the top device substrate.

21. The device package of claim 1, further comprising a light blocking mask for absorbing or blocking visible light.

22. The device package of claim 21, wherein the light blocking mask is disposed on a surface of the top substrate.

23. The device package of claim 1, wherein the package substrate is ceramic.

24. The device package of claim 1, wherein the package frame comprises a metallic material.

25. The device package of claim 24, wherein the package frame comprises copper.

26. The device package of claim 24, wherein the package frame comprises aluminum.

27. The device package of claim 24, wherein the package frame comprises a plastic material.

28. The device package of claim 1, further comprising wirebonds disposed within the second cavity and electrically connecting the semiconductor substrate to the package substrate.

29. A device package comprising:
   a package substrate;
   a microstructure device comprising top and bottom device substrates that are bonded together so as to form a first gap therebetween, wherein a microstructure is disposed within the first gap, wherein the bottom device substrate is attached to the packaging substrate; and a hermetic connector hermetically bonded to the top device substrate and to the package substrate so as to form a second gap between the hermetic connector and the package substrate.

30. The device package of claim 29, wherein the hermetic connector is a packaging frame.

31. The device package of claim 30, further comprising a getter that is hermetically sealed within the second gap between the packaging frame and the packaging substrate.

32. The device package of claim 30, further comprising a lubricant that is hermetically sealed within the second gap between the packaging frame and the package substrate.

33. The device package of claim 30, wherein the packaging frame comprises a frame base, a frame wall, and a frame ledge, wherein the frame base is hermetically bonded to the packaging substrate, and wherein the frame ledge is hermetically bonded to an upper surface of the top substrate of the microstructure device.

34. The device package of claim 33, wherein the frame ledge is bonded to the upper surface using first solder material.

35. The device package of claim 34, wherein the frame base is bonded to the package substrate using second solder material.

36. The device package of claim 29, wherein the top device substrate is non-hermetically bonded to the bottom device substrate.

37. The device package of claim 29, wherein the microstructure device is a light emitting device or a light detecting device.

38. The device package of claim 29, wherein the microstructure device is a spatial light modulator.

39. The device package of claim 38, wherein the spatial light modulator comprises an array of deflectable reflective mirror plates and an array of addressing electrodes associated with the array of mirror plates for deflecting the mirror plates.

40. The device package of claim 39, wherein the mirror plates are disposed on the top device substrate that is light transmissive.

41. The device package of claim 40, wherein the addressing electrodes are disposed on the bottom device substrate that comprises a semiconductor material.

42. The device package of claim 40, further comprising a getter disposed between the top and bottom substrates of the microstructure device.

43. The device package of claim 40, further comprising a lubricant material disposed between the top and bottom substrates of the microstructure device.

44. The device package of claim 39, wherein the addressing electrodes and the mirror plates are disposed on the bottom substrate.

45. The device package of claim 29, further comprising a light blocking/absorbing frame for blocking/absorbing visible light incident around the perimeter of the top device substrate.

46. The device package of claim 29, further comprising a light blocking mask for absorbing or blocking visible light.

47. The device package of claim 46, wherein the light blocking mask is disposed on a surface of the top substrate.

48. The device package of claim 29, wherein the package substrate is ceramic.

49. The device package of claim 29, wherein the hermetic connector comprises a metallic material.

50. The device package of claim 49, wherein the hermetic connector comprises copper.

51. The device package of claim 49, wherein the hermetic connector comprises aluminum.

52. The device package of claim 49, wherein the hermetic connector comprises a plastic material.

53. The device package of claim 29, wherein the hermetic connector is flexible.

54. The device package of claim 29, further comprising wirebonds disposed within the second gap and electrically connecting the bottom substrate to the package substrate.

55. A projection system comprising:
a light source;
a first optical device optically coupled to an output of the light source;
a spatial light modulator optically coupled to an output of the optical device, the spatial light modulator comprising
a top substrate,
a semiconductor substrate comprising an array of deflectable reflective mirror plates and an array of addressing electrodes associated with the array of mirror plates for deflecting the mirror plates, said semiconductor substrate bonded to the top substrate forming a first cavity therebetween,
a package substrate on which the semiconductor substrate is disposed, and
a package frame that is hermetically bonded to the top substrate and to the package substrate forming a second cavity between the package frame and the package substrate; and
a second optical device optically coupled to an output of the spatial light modulator.

* * * * *